(12) United States Patent
Bathan et al.

(10) Patent No.: US 8,803,300 B2
(45) Date of Patent: Aug. 12, 2014

(54) INTEGRATED CIRCUIT PACKAGING SYSTEM WITH PROTECTIVE COATING AND METHOD OF MANUFACTURE THEREOF

(75) Inventors: Henry Descalzo Bathan, Singapore (SG); Zigmund Ramirez Camacho, Singapore (SG); Emmanuel Espiritu, Singapore (SG); Jeffrey D. Punzalan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 476 days.

(21) Appl. No.: 12/889,911

(22) Filed: Sep. 24, 2010

(65) Prior Publication Data

US 2011/0079888 A1    Apr. 7, 2011

Related U.S. Application Data

(60) Provisional application No. 61/247,573, filed on Oct. 1, 2009.

(51) Int. Cl.
*H01L 23/495* (2006.01)

(52) U.S. Cl.
USPC .............. 257/676; 257/E23.031; 438/123

(58) Field of Classification Search
CPC ............ H01L 23/49579; H01L 23/49582; H01L 23/49586; H01L 23/49503; H01L 23/49541; H01L 23/49548
USPC .................... 257/676, E23.031; 438/123
See application file for complete search history.

(56) References Cited

U.S. PATENT DOCUMENTS

| | | | |
|---|---|---|---|
| 6,072,239 A | 6/2000 | Yoneda et al. | |
| 6,528,877 B2 | 3/2003 | Ernst et al. | |
| 6,635,957 B2 | 10/2003 | Kwan et al. | |
| 7,187,072 B2 | 3/2007 | Fukutomi et al. | |
| 7,687,893 B2 | 3/2010 | Smith | |
| 8,063,470 B1 * | 11/2011 | Sirinorakul et al. | 257/E23.031 |
| 2008/0079127 A1 * | 4/2008 | Gerber | 257/676 |
| 2008/0277456 A1 | 11/2008 | Gowda et al. | |
| 2009/0032943 A1 * | 2/2009 | Shoji et al. | 257/E23.01 |
| 2009/0127682 A1 | 5/2009 | Kim et al. | |
| 2009/0230524 A1 * | 9/2009 | Chien et al. | 257/676 |
| 2011/0201159 A1 * | 8/2011 | Mori et al. | 438/123 |

FOREIGN PATENT DOCUMENTS

JP    2007-157846    6/2007

* cited by examiner

*Primary Examiner* — Stephen W Smoot
*Assistant Examiner* — Sun M Kim
(74) *Attorney, Agent, or Firm* — Ishimaru & Associates LLP

(57) ABSTRACT

A method of manufacture of an integrated circuit packaging system includes: forming a lead-frame having a die attach paddle and a contact pad connected by a link; mounting an integrated circuit die over the die attach paddle; molding a package body on the lead-frame and the integrated circuit die including leaving portions of the die attach paddle, the contact pad, and the link exposed from the package body; forming an exposed edge by etching away the link between the contact pad, and the die attach paddle; and depositing a solder-resistant layer on the exposed edge.

16 Claims, 6 Drawing Sheets

INTEGRATED CIRCUIT PACKAGING SYSTEM WITH PROTECTIVE COATING AND METHOD OF MANUFACTURE THEREOF

CROSS-REFERENCE TO RELATED APPLICATION(S)

This application claims the benefit of U.S. Provisional Patent Application Ser. No. 61/247,573 filed Oct. 1, 2009, and the subject matter thereof is incorporated herein by reference thereto.

TECHNICAL FIELD

The present invention relates generally to an integrated circuit packaging system, and more particularly to a system for integrated circuit packages having high reliability contacts.

BACKGROUND ART

Current semiconductor packaging technology often involves tradeoffs between ease and efficiency of manufacturing on the one hand, and various performance drawbacks on the other. For example, lead-frame based packages such as quad flat no-lead (QFN) packages employ lead-frames to facilitate the packaging and singulation of multiple units at once.

The lead-frame approach is desirable due to the reduced cost, but the close proximity of solder contacts has lead to fabrication problems due to solder shorts. The contact reliability is reduced if the packages must be removed to repair solder shorts.

However, lead-frame based packages, whose connectors are typically placed either on or extending from the sides, tend to have larger footprints than ball grid array (BGA) packages, whose solder ball connectors lie directly underneath the package. Unfortunately, BGA packages have drawbacks as well. Specifically, such packages often employ laminate substrates rather than uniform metal lead-frames, making them more expensive to produce than lead-frame based packages, and less efficiently manufactured.

It is therefore desirable to design packages that employ lead-frames for ease and efficiency of manufacture, but that also have BGA-type solder ball connectors for reduced footprint sizes. In light of the increased requirements for package cost and reliability, it is further desirable to improve various aspects of the design and manufacture of these packages.

The increase in Input/Output (I/O) pin count also requires a degree of precision in the placement of the package in order to prevent inadvertent solder connections between adjacent I/O pins. The process used to remove the package from a circuit board may damage the package or reduce its long term reliability.

Thus, a need still remains for an integrated circuit packaging system with protective coating for increased reliability of connection without rework risk. In view of the demand for packages having a high density of contact connections, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system includes: forming a lead-frame having a die attach paddle and a contact pad connected by a link; mounting an integrated circuit die over the die attach paddle; molding a package body on the lead-frame and the integrated circuit die including leaving portions of the die attach paddle, the contact pad, and the link exposed from the package body; forming an exposed edge by etching away the link between the contact pad and the die attach paddle; and depositing a solder-resistant layer on the exposed edge.

The present invention provides an integrated circuit packaging system, including: a die attach paddle; a contact pad adjacent to the die attach paddle; an integrated circuit die mounted over the die attach paddle; a package body molded on the integrated circuit die includes portions of the die attach paddle and the contact pad exposed from a bottom of the package body; a protrusion in the contact pad adjacent to the package body with the contact pad extended below the package body; and a solder-resistant layer on the protrusion and not on a bottom of the contact pad.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
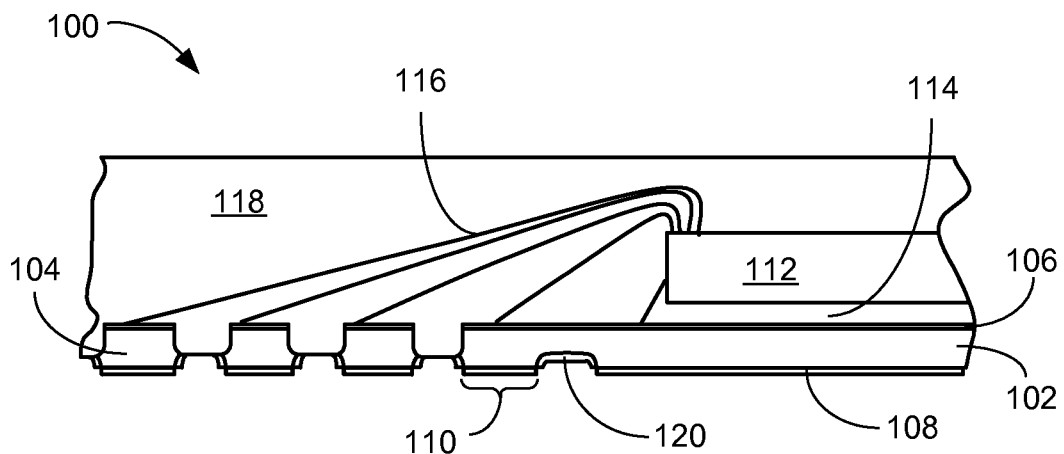
FIG. 1 is a cross-sectional view of an integrated circuit packaging system with protective coating in an embodiment of the present invention.

The following embodiments are described in sufficient detail to enable those skilled in the art to make and use the invention. It is to be understood that other embodiments would be evident based on the present disclosure, and that system, process, or mechanical changes can be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements with no intervening materials.

The term "processing" as used herein includes deposition of material or photoresist, patterning, exposure, development, etching, cleaning, and/or removal of the material or photoresist as required in forming a described structure. The term "patterning" as used herein means applying a material in specific regions, which can require a mask and deposition process.

Referring now to FIG. 1, therein is shown a cross-sectional view of an integrated circuit packaging system 100 with protective coating in an embodiment of the present invention. The cross-sectional view of the integrated circuit packaging system 100 depicts a die attach paddle 102 and contact pads 104, each having been formed from a lead frame (not shown).

The die attach paddle 102 and the contact pads 104 have a wire bondable layer 106 patterned on a top side and a solderable layer 108 patterned on a bottom side. The wire bondable layer 106 is a metallic coating including Gold (Au), Silver (Ag), or Aluminum (Al). The wire bondable layer 106 is patterned to form a bonding surface on the die attach paddle 102 and the contact pads 104.

The solderable layer 108 is patterned below the wire bondable layer 106. The solderable layer 108 is patterned to form a solder wettable area 110 below the wire bondable layer 106. The solderable layer 108 is a metallic coating including Nickel (Ni), Gold (Au), Aluminum (Al), Chromium (Cr), or an alloy thereof.

An integrated circuit die 112 is mounted over the die attach paddle 102 by an adhesive 114, such as a die attach adhesive. Electrical interconnects 116, such as bonding wires of Gold (Au) or Aluminum (Al), electrically connects the integrated circuit die 112 to the bonding surface on the die attach paddle 102, the contact pads 104, or a combination thereof.

A package body 118 is formed by molding an epoxy molding compound on the die attach paddle 102, the contact pads 104, the integrated circuit die 112, the adhesive 114 and the electrical interconnects 116. The package body 118 has a lower surface formed between the die attach paddle 102 and the contact pads 104.

A solder-resistant layer 120 is formed adjacent to the solder wettable area 110. The solder-resistant layer 120 is a layer that is not solder wettable and could include solder-resist material, Titanium, or oxide of metal. The solder-resistant layer 120 is formed on a portion of the die attach paddle 102 and the contact pads 104 that is exposed below the bottom surface of the package body 118 and not covered by the solder wettable area 110.

A current problem in the mounting of integrated circuit packages is creeping solder. The creeping solder is solder that flows beyond the desired area during the reflow process, which may cause unintended connections between the contact pads 104. The solder-resistant layer 120 will prevent creeping solder (not shown) from causing inconsistent solder ball collapse and distribution during package mounting and reflow processes. It has been discovered that the application of the solder-resistant layer 120 reduces or eliminates the occurrence of solder shorts between the die attach paddle 102 or the contact pads 104. This aspect of the present invention provides the ability to increase the number of the contact pads 104 possible in a given package area because of the controlled collapse of solder balls (not shown).

The number and position of the contact pads 104 is an example only and a different number and position of the contact pads 104 is possible. The spacing between the contact pads 104 can be reduced beyond what was possible in prior art packages.

Figure 2:
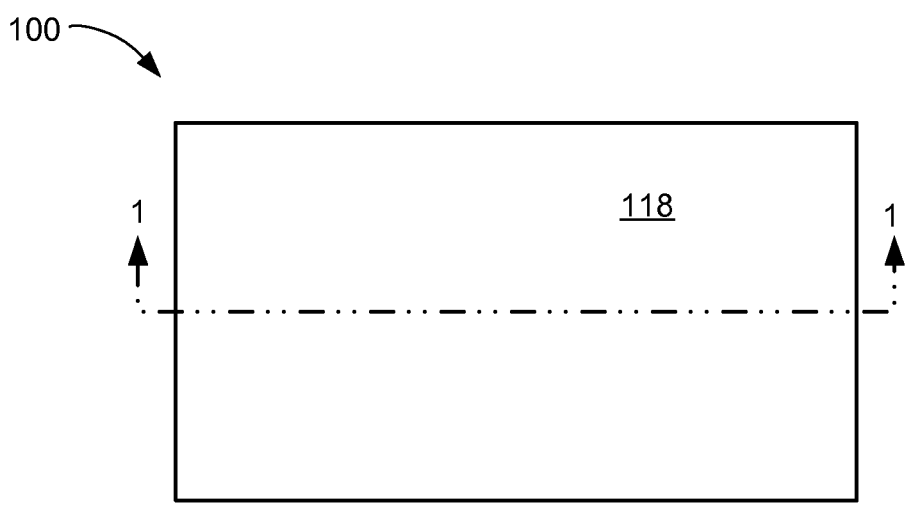
FIG. 2 is a top view of the integrated circuit packaging system in an embodiment of the present invention.

Referring now to FIG. 2, therein is shown a top view of the integrated circuit packaging system 100 in an embodiment of the present invention. The top view of the integrated circuit packaging system 100 depicts the package body 118 in a rectangular shape.

It is understood that the rectangular shape of the package body 118 is an example only and the package body 118 may be square or some other geometric shape. The section line 1--1 indicates the location and direction of view of the cross-sectional view of FIG. 1 and is characteristic of all of the cross-sectional views.

Figure 3:
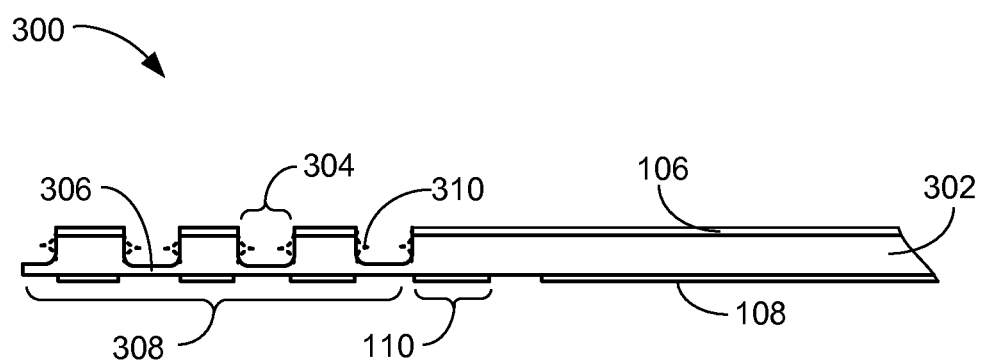
FIG. 3 is a cross-sectional view of a pre-plated frame segment in a lead frame forming phase of manufacture.

Referring now to FIG. 3, therein is shown a cross-sectional view of a pre-plated frame segment 300 in a lead-frame forming phase of manufacture. The cross-sectional view of the pre-plated frame segment 300 depicts a lead-frame 302, such as a copper lead-frame, having recesses 304 formed in the top surface between the patterned areas of the wire bondable layer 106.

The recesses 304 can be formed by a stamping process, an etching process, or a combination thereof. The recesses terminate at links 306 that couple the regions adjacent to the recesses 304. The wire bondable layer 106 can be patterned prior to forming the recesses 304 or afterward. The wire bondable layer 106 is not formed in the recesses 304.

The solderable layer 108 is patterned on the bottom surface of the lead-frame 302 to form the solder wettable area 110. A contact region 308 contains an array of the solder wettable area 110 that will identify the position of the contact pads 104, of FIG. 1.

The number and position of the recesses 304 is an example only and the actual number and position may differ. The relative size of the links 306 is also an example. The recesses 304 can be formed by a series of etching processes or a stamping process followed by an etching process in order to form protrusions 310 on the sidewall of the recesses 304. The protrusions 310 may be useful in preventing lead pull-out in a finished package (not shown).

Figure 4:
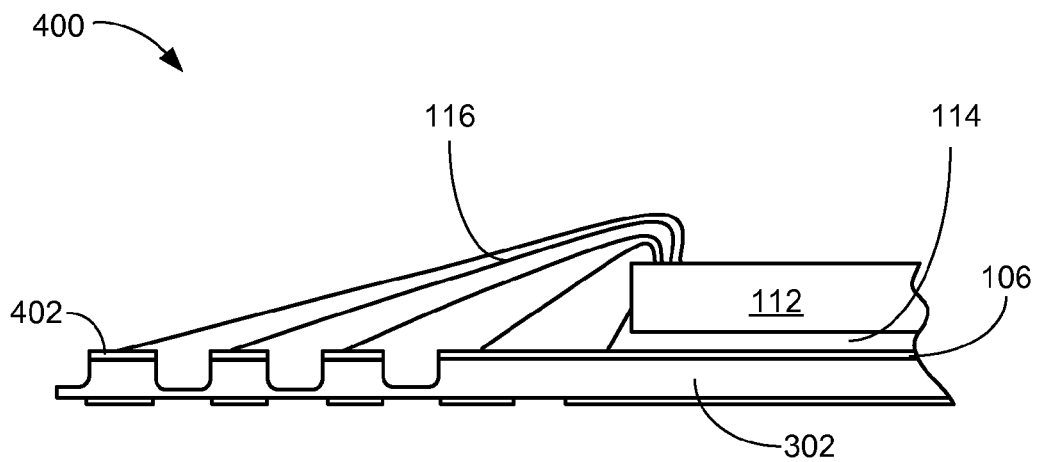
FIG. 4 is a cross-sectional view of an integrated circuit assembly in a mount and interconnect phase of manufacturing.

Referring now to FIG. 4, therein is shown a cross-sectional view of an integrated circuit assembly 400 in a mount and interconnect phase of manufacturing. The cross-sectional view of the integrated circuit assembly 400 depicts the lead-frame 302 having the integrated circuit die 112 mounted by the adhesive 114.

The electrical interconnects 116 are coupled between the integrated circuit die 112 and to a bonding contact 402. The bonding contact 402 is formed by the electrical interconnects 116 being welded to the wire bondable layer 106. The material used for the wire bondable layer 106 must be compatible with the material of the electrical interconnects 116.

Figure 5:
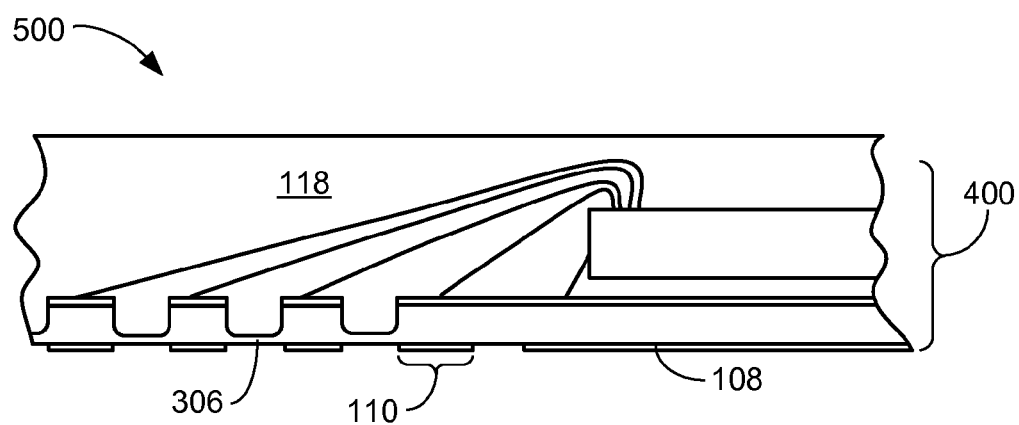
FIG. 5 is a cross-sectional view of an integrated circuit assembly in an encapsulation phase of manufacturing.

Referring now to FIG. 5, therein is shown a cross-sectional view of an integrated circuit assembly 500 in an encapsulation phase of manufacturing. The cross-sectional view of the integrated circuit assembly 500 depicts the integrated circuit assembly 400 having the package body 118 formed thereon.

The package body 118 completely covers the top side of the integrated circuit assembly 400 including filling the space down to the links 306. The bottom surface of the links 306 are exposed between the patterns of the solderable layer 108 that form the solder wettable area 110.

It is understood that the integrated circuit assembly 500 is a segment of a lead-frame panel that is used to manufacture multiple integrated circuit packages (not shown) in a bulk process. It is understood that the manufacturing of multiple packages in a panel format is commonly known in the manufacturing of integrated circuit packages and is therefore not shown in this application.

Figure 6:
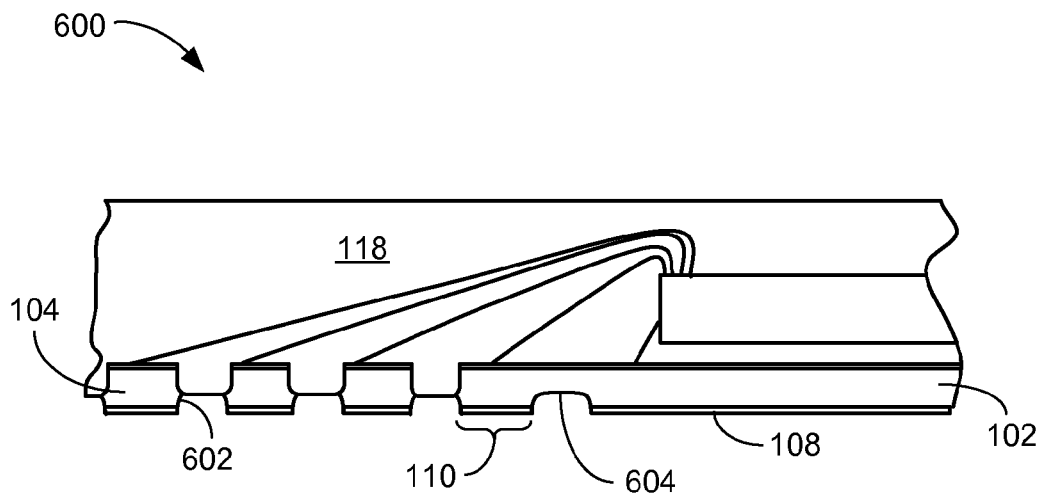
FIG. 6 is a cross-sectional view of an integrated circuit assembly in an etching phase of manufacturing.

Referring now to FIG. 6, therein is shown a cross-sectional view of an integrated circuit assembly 600 in an etching phase of manufacturing. The cross-sectional view of the integrated circuit assembly 600 depicts the die attach paddle 102 and the contact pads 104 having been separated from the lead-frame 302, of FIG. 2, by etching away the links 306, of FIG. 2.

The etching process exposes the package body 118 around the contact pads 104 and the die attach paddle 102. An exposed edge 602 is exposed between the solder wettable area 110 and the exposed portions of the package body 118. A paddle recess 604 can be formed opposite the integrated circuit die 112 in a bottom side of the die attach paddle 102 between the pattern of the solderable layer 108 and spaced away from a peripheral edge of the die attach paddle 102.

Figure 7:
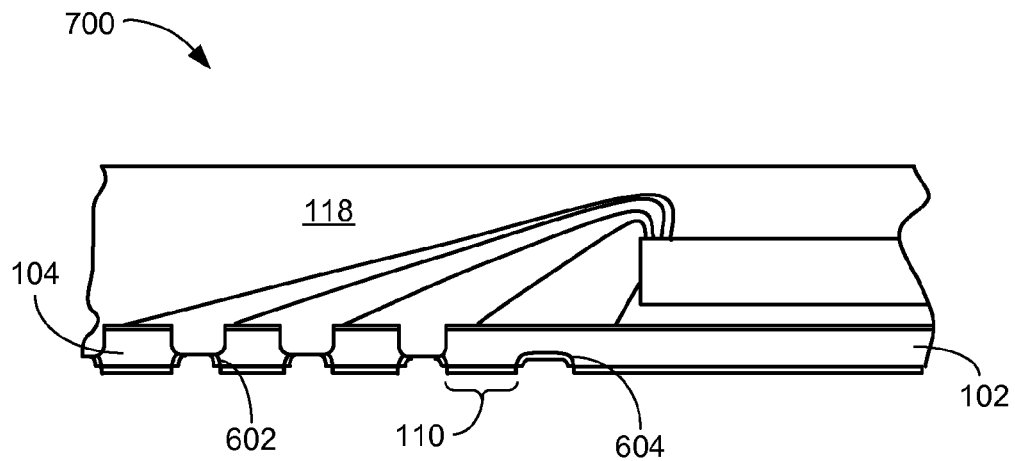
FIG. 7 is a cross-sectional view of an integrated circuit assembly in an insulation phase of manufacturing.

Referring now to FIG. 7, therein is shown a cross-sectional view of an integrated circuit assembly 700 in an insulation phase of manufacturing. The cross-sectional view of the integrated circuit assembly 700 depicts the solder-resistant layer 120 formed on the exposed edge 602 and the paddle recess 604.

The solder-resistant layer 120 is a layer of solder-resist material, Titanium, or oxide of metal base. The solder-resistant layer 120 prevents the creeping of solder beyond the solder wettable area 110. By preventing creeping of the solder during reflow, a controlled solder ball collapse can be maintained.

It has been discovered that the addition of the solder-resistant layer 120 adjacent to the solder wettable area 110 prevents solder creeping and allows the contact pads 104 to be positioned closer together and closer to the die attach paddle 102. By decreasing the spacing of the contact pads 104, additional rows of pads can be added to a given size package or a package, with a fixed number of the contact pads 104, can be made smaller.

Figure 8:
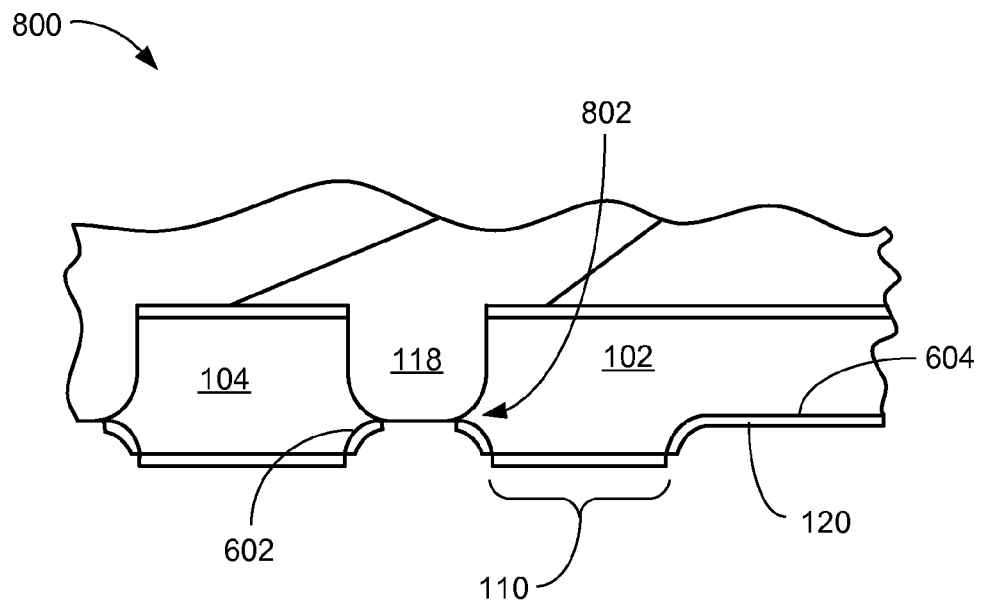
FIG. 8 is an expanded cross-sectional view of a lead-frame section of the integrated circuit assembly of FIG. 7.

Referring now to FIG. 8, therein is shown an expanded cross-sectional view of a lead-frame section 800 of the integrated circuit assembly of FIG. 7. The expanded cross-sectional view of the lead-frame section 800 depicts the die attach paddle 102 having the paddle recess 604 with the solder-resistant layer 120 formed in the paddle recess 604.

A characteristic of the present invention is a protrusion 802 formed at the boundary of the package body 118 and the exposed edge 602. The protrusion 802 is evident from the deposition of the solder-resistant layer 120 adjacent to the exposed areas of the package body 118 on the package bottom.

Figure 9:
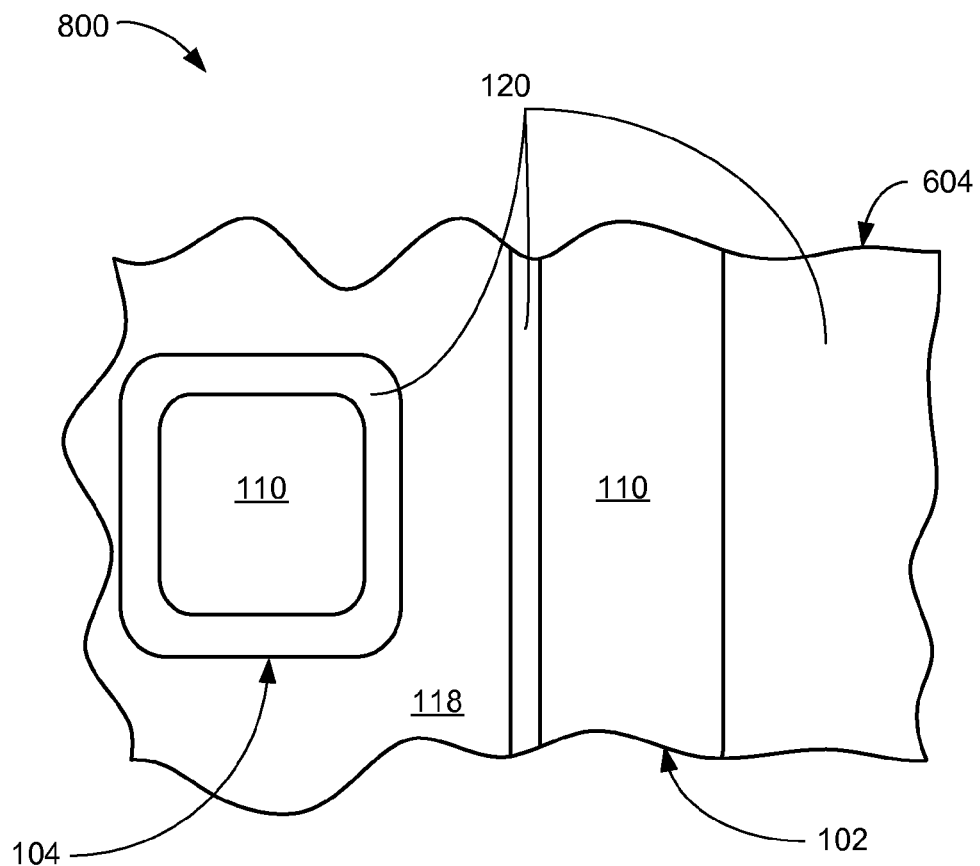
FIG. 9 is a bottom view of the lead-frame section of FIG. 8.

Referring now to FIG. 9, therein is shown a bottom view of the lead-frame section 800 of FIG. 8. The bottom view of the lead-frame section 800 depicts the pattern of the solder-resistant layer 120 formed between the solder wettable area 110 of the contact pads 104 and the die attach paddle 102. The solder-resistant layer 120 is also seen in the paddle recess 604.

A characteristic of the present invention is that the solder wettable area 110 of the contact pads 104 are separated from each other by the package body 118, exposed between the contact pads 104, and the solder-resistant layer 120. The solder-resistant layer 120 deposited in the paddle recess 604 assists in providing a controlled collapse of solder balls (not shown) during the reflow process used to attach the integrated circuit packaging system 100 to a circuit board (not shown). The solder-resistant layer 120 can be a ring-like structure surrounding the solder wettable area 110 under the contact pads 104.

Figure 10:
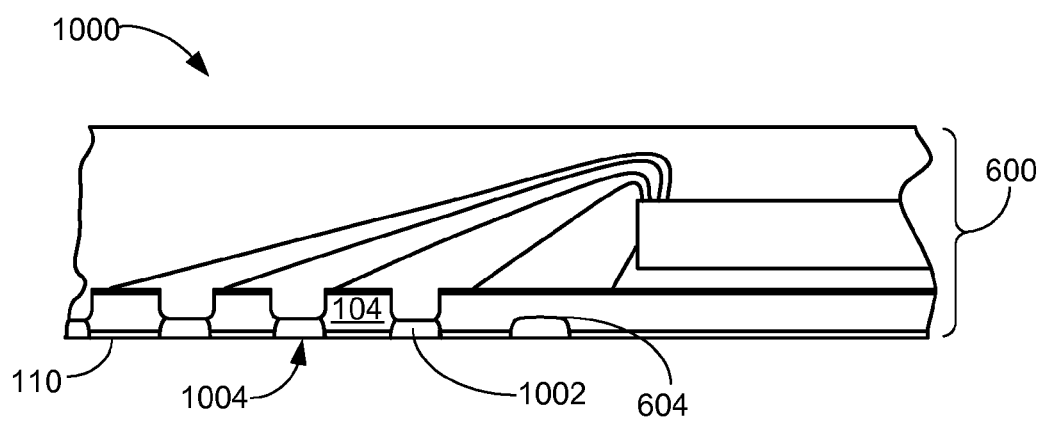
FIG. 10 is a cross-sectional view of an integrated circuit packaging system with protective coating in an alternative embodiment of the present invention.

Referring now to FIG. 10, therein is shown a cross-sectional view of an integrated circuit packaging system 1000 with protective coating in an alternative embodiment of the present invention. The cross-sectional view of the integrated circuit packaging system 1000 depicts the integrated circuit assembly 600 with a protective coating 1002, such as a solder resist layer.

The protective coating 1002 can form a coplanar surface 1004 with the solder wettable area 110. The protective coating 1002 fills the paddle recess 604 and the space between the contact pads 104, providing the coplanar surface 1004.

Figure 11:
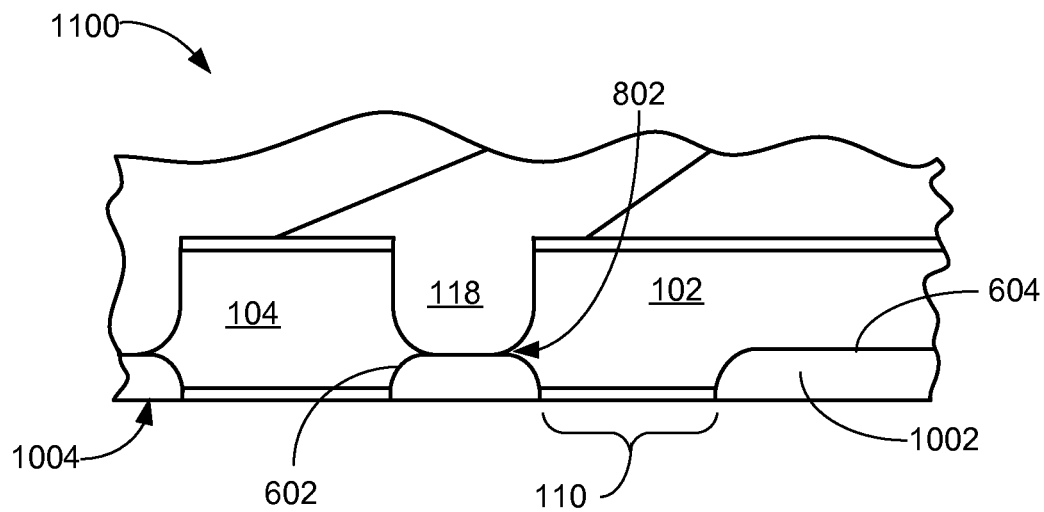
FIG. 11 is an expanded cross-sectional view of a lead-frame section of the integrated circuit assembly of FIG. 10.

Referring now to FIG. 11, therein is shown an expanded cross-sectional view of a lead-frame section 1100 of the integrated circuit assembly of FIG. 10. The expanded cross-sectional view of the lead-frame section 1100 depicts the die attach paddle 102 having the paddle recess 604 with the protective coating 1002 formed in the paddle recess 604.

A characteristic of the present invention is the protrusion 802 formed at the boundary of the package body 118 and the exposed edge 602 of the contact pads 104 and the die attach paddle 102. The protrusion 802 is concealed by the protective coating 1002 that forms the coplanar surface 1004 with the solder wettable area 110 on the package bottom.

Figure 12:
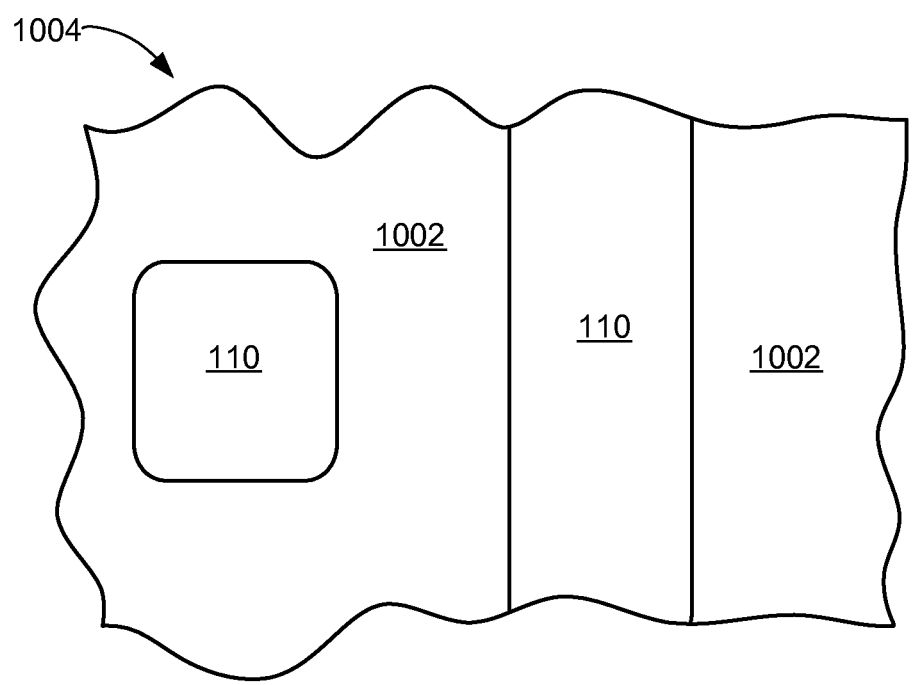
FIG. 12 is a bottom view of the coplanar surface of FIG. 10.

Referring now to FIG. 12, therein is shown a bottom view of the coplanar surface 904 of FIG. 10. The solder wettable area 110 of the contact pads 104 and the die attach paddle 102 is surrounded by the protective coating 1002.

It has been discovered that the protective coating 1002 of the coplanar surface 1004 provides a barrier to creeping solder, while providing additional protection to the contact pads 104 and the die attach paddle 102.

Figure 13:
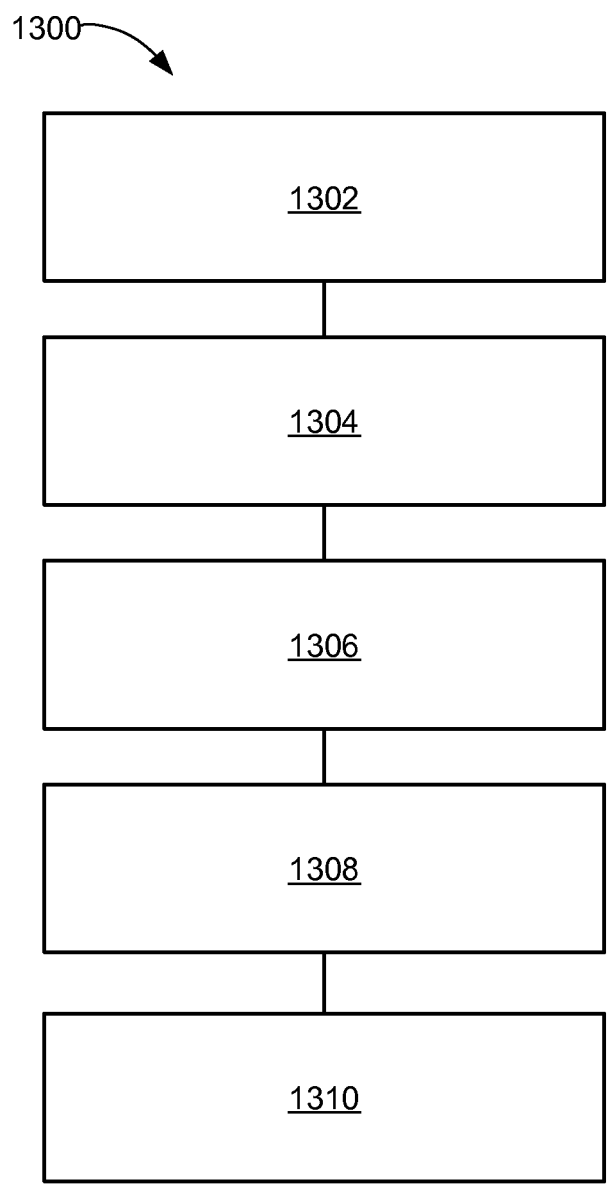
FIG. 13 is a flow chart of a method of manufacture of the integrated circuit packaging system in a further embodiment of the present invention.

Referring now to FIG. 13, therein is shown a flow chart of a method 1300 of manufacture of the integrated circuit packaging system 100 in a further embodiment of the present invention. The method 1300 includes: forming a lead-frame having a die attach paddle and a contact pad connected by a link in a block 1302; mounting an integrated circuit die over the die attach paddle in a block 1304; molding a package body on the lead-frame and the integrated circuit die including leaving portions of the die attach paddle, the contact pad, and the link exposed from the package body in a block 1306; forming an exposed edge by etching away the link between the contact pad and the die attach paddle in a block 1308; and depositing a solder-resistant layer on the exposed edge in a block 1310.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   forming a lead-frame having a die attach paddle and a contact pad adjacent the die attach paddle, the die attach paddle and the contact pad connected by a link;
   mounting an integrated circuit die over the die attach paddle;
   forming a protrusion at a peripheral edge of the die attach paddle and an exposed edge about the contact pad by etching away the link between the contact pad and the die attach paddle, and forming a paddle recess in a bottom of the die attach paddle by partially etching a portion of the bottom of the die attach paddle spaced away from the peripheral edge of the die attach paddle;
   molding a package body on the lead-frame and the integrated circuit die, including portions of the die attach paddle and the contact pad, the package body having an exposed bottom between the die attach paddle and the contact pad leaving the protrusion and the exposed edge exposed from the package body, and portions of the die attach paddle and the contact pad exposed and extending below the package body; and
   depositing a solder-resistant layer on the protrusion, the exposed edge, and in the paddle recess, but not on bottoms of the lead-frame under the die attach paddle or the contact pad or the exposed bottom of the package body, the solder-resistant layer consists of an oxide of metal.

2. The method as claimed in claim 1 further comprising coupling an electrical interconnect between the integrated circuit die and the contact pad.

3. The method as claimed in claim 1 further comprising forming a recess in a top surface of the lead-frame by stamping, etching, or a combination thereof.

4. A method of manufacture of an integrated circuit packaging system comprising:
   forming a lead-frame having a die attach paddle and contact pads adjacent the die attach paddle, the die attach paddle and the contact pads connected by links;
   patterning a solder wettable area on a bottom of the lead-frame under the contact pads and the die attach paddle;
   mounting an integrated circuit die over the die attach paddle including applying an adhesive between the die attach paddle and the integrated circuit die;
   forming a protrusion at a peripheral edge of the die attach paddle and exposed edges about the contact pads by etching away the links between the contact pads and the die attach paddle, and forming a paddle recess in a bottom of the die attach paddle by partially etching a portion of the bottom of the die attach paddle spaced away from the peripheral edge of the die attach paddle;
   molding a package body on the lead-frame and the integrated circuit die, including portions of the die attach paddle and the contact pads, the package body having exposed bottoms between the die attach paddle and the contact pads leaving the protrusion and the exposed edges exposed from the package body, and portions of the die attach paddle and the contact pads exposed and extending below the package body; and
   depositing a solder-resistant layer on the protrusion, the exposed edges, and in the paddle recess, but not on bottoms of the lead-frame under the die attach paddle or the contact pads or the exposed bottom of the package body, the solder-resist layer consists of an oxide of metal.

5. The method as claimed in claim 4 further comprising coupling electrical interconnects between the integrated circuit die and the contact pads, the die attach paddle, or a combination thereof.

6. The method as claimed in claim 4 further comprising:
   forming recesses in a top surface of the lead-frame by stamping, etching, or a combination thereof for forming the links; and
wherein:
   molding the package body includes filling the recesses by the package body.

7. The method as claimed in claim 4 wherein depositing the solder-resistant layer includes depositing the oxide of metal as a ring surrounding the solder wettable area under the contact pads.

8. The method as claimed in claim 4 further comprising forming the protrusion includes forming a recess, in the lead-frame, having the protrusion in the sidewall by stamping and then etching.

9. An integrated circuit packaging system comprising:
   a die attach paddle having a paddle recess in a bottom of the die attach paddle spaced away from a peripheral edge of the die attach paddle;
   a protrusion at the peripheral edge of the die attach paddle;
   a contact pad adjacent to the die attach paddle, the contact pad having an exposed edge;
   an integrated circuit die mounted over the die attach paddle;
   a package body molded on the integrated circuit die including portions of the die attach paddle and the contact pad, the package body having an exposed bottom between the die attach paddle and the contact pad, wherein portions of the die attach paddle and the contact pad extend below and are exposed from the package body, and wherein the protrusion and the exposed edge are exposed from the package body; and
   a solder-resistant layer on the protrusion, the exposed edge, and in the paddle recess, but not on a bottom of the contact pad or the bottom of the die attach paddle or the exposed bottom of the package body, the solder-resistant layer consists of an oxide of metal.

10. The system as claimed in claim 9 further comprising an electrical interconnect between the integrated circuit die and the contact pad.

11. The system as claimed in claim 9 further comprising a bonding contact on a top of the contact pad.

12. The system as claimed in claim 9 further comprising:
   a solder wettable area on the bottom of the contact pad and the bottom of the die attach paddle; and
   an adhesive between the integrated circuit die and a top of the die attach paddle.

13. The system as claimed in claim 12 further comprising an electrical interconnect between the integrated circuit die and the contact pad, the die attach paddle, or a combination thereof.

14. The system as claimed in claim 12 further comprising a bonding contact on a top of the contact pad and the die attach paddle.

15. The system as claimed in claim 12 wherein the contact pad adjacent to the die attach paddle includes multiple rows of contact pads around the die attach paddle.

16. The system as claimed in claim 12 wherein the solder-resistant layer forms a ring surrounding the solder wettable area under the contact pads.

\* \* \* \* \*